United States Patent [19]

Lucas

[11] Patent Number: 4,857,930
[45] Date of Patent: Aug. 15, 1989

[54] CIRCUIT FOR REDUCING DIFFERENTIAL NONLINEARITIES IN MULTI-STAGE DIGITAL-TO-ANALOG CONVERTERS

[75] Inventor: Charles H. Lucas, Newport Beach, Calif.

[73] Assignee: Hughes Aircraft Company, Los Angeles, Calif.

[21] Appl. No.: 879,771

[22] Filed: Jun. 27, 1986

[51] Int. Cl.$^4$ .............................................. H03M 1/74
[52] U.S. Cl. .................................... 341/150; 341/118
[58] Field of Search .................. 340/347 DA, 347 CC, 340/347 M; 341/118, 122, 144, 150, 153, 165, 172

[56] References Cited

U.S. PATENT DOCUMENTS

| | | | |
|---|---|---|---|
| 3,051,938 | 8/1962 | Levy | 340/347 DD X |
| 3,217,147 | 11/1965 | Chapman, Jr. | 340/347 M X |
| 3,541,446 | 11/1970 | Prozeller | 340/347 NT X |
| 4,029,949 | 6/1977 | Dew | 235/151.11 |
| 4,337,459 | 6/1982 | Takahashi et al. | 340/347 DA |
| 4,380,756 | 4/1983 | Worsman | 340/347 C X |
| 4,703,310 | 10/1987 | van de Plassche | 340/347 SH X |

OTHER PUBLICATIONS

Yee, Adaptive Reference Voltage Adjustment for an Analog-To-Digital Converter, IBM Tech. Discl. Bull., vol. 19, No. 6, 11/1976, pp. 2360-2362.

Timbie et al., Principles of Electrical Engineering, J. Wiley & Sons, Inc., 1922, pp. 310 & 311.

Primary Examiner—William M. Shoop, Jr.
Assistant Examiner—Marc S. Hoff
Attorney, Agent, or Firm—Terje Gudmestad; Mark J. Meltzer

[57] ABSTRACT

A switched capacitor array (20) for use in a digital-to-analog converter (10), an analog-to-digital converter (60), or other digitally controlled circuit is disclosed. The array includes a plurality of switched capacitors (C(0) through C(15)) of substantially identical value, each having a switched terminal. Logic circuitry (17) responsive to a digital input signal (A) having a value N provides a logic output signal indicative of the digital input signal. Gating circuitry (40) responsive to the logic output signal switches the switched terminal of a selected switched capacitor to an analog signal provided by a digital-to-analog converter stage of lesser weight, and sequentially switches the switched terminals of a predetermined number of the switched capacitors to a predetermined voltage. The selected capacitor and such predetermined number of capacitors are determined by the value N of the digital input signal.

12 Claims, 4 Drawing Sheets

CIRCUIT FOR REDUCING DIFFERENTIAL NONLINEARITIES IN MULTI-STAGE DIGITAL-TO-ANALOG CONVERTERS

BACKGROUND OF THE INVENTION

The disclosed invention generally relates to digital-to-analog converters and analog-to-digital converters, and is particularly directed to a switched capacitor array for use in multi-stage converters and which provides reduced differential non-linearities resulting from coupling one stage to another.

Digital-to-analog (D/A) converters are utilized to provide an analog signal, such as a voltage, as a function of a digital input. Analog-to-digital (A/D) converters are utilized in systems wherein analog signals, such as those provided by analog transducers, are processed digitally.

Conversion of digital signals having a large number of bits (e.g., eights bits or greater) may be more advantageously provided with the use of staged digital-to-analog converters wherein the digital signals are divided into groups which are then converted by respective staged digital-to-analog converters. The staged digital-to-analog converters are cascaded so that the output of the converter for the least significant group of bits is coupled as an input to the converter for next significant group, and so forth. For converters that utilize capacitors as the weighting elements, such coupling is provided an LSB capacitor, which scales the contribution of the group of bits having lesser significance or weight.

However, the use of an LSB capacitor results in differential nonlinearity where the LSB capacitor is not precisely the same value as the other capacitors of the stage receiving the input from a converter stage of lesser significance.

SUMMARY OF THE INVENTION

It would therefore be an advantage to provide a switched element array for use in multi-stage D/A and A/D converters which achieves reduced differential nonlinearities.

It would also be an advantage to provide a switched element array for use in multi-stage D/A and A/D converters which reduces the differential nonlinearities associated with LSB elements utilized to couple adjacent stages of multi-stage D/A and A/D converters.

Another advantage would be to provide a switched element array for use in multi-stage D/A and A/D converters which includes switched elements of substantially identical value.

Still another advantage would be to provide a switched element array for use in multi-stage D/A and A/D converters which is readily implemented with integrated circuitry.

The foregoing and other advantages and features are provided in a switched element array having a plurality of switched elements of substantially identical value which may be capacitors, resistors, or current sources. Where the switched elements are capacitors, the array includes a plurality of switched capacitors of substantially identical value, each having a switched terminal. Logic circuitry responsive to a digital input having a value N provides a logic output indicative of the digital input. Gating circuitry responsive to the logic output (a) switches the switched terminal of a selected switched capacitor to an analog signal output provided by a digital-to-analog converter stage of lesser weight, and (b) sequentially switches the switched terminals of a predetermined number of the switched capacitors. The selected capacitor and the predetermined number of capacitors are determined by the value N of the digital input.

A further aspect of the invention is directed to a method for converting a digital input having a value N to an analog signal. The method includes the steps of (a) conditioning the digital input to provide a logic output indicative of the digital input, (b) selecting in response to the logic output an input capacitor and a predetermined number of capacitors from a group of capacitors having substantially identical values, where the input capacitor and such predetermined number are determined by the value N of the digital input, (c) switching the input capacitor to the output of a digital-to-analog converter of lesser weight, and (d) sequentially switching the predetermined number of capacitors to a predetermined voltage.

BRIEF DESCRIPTION OF THE DRAWING

The advantages and features of the disclosed invention will readily be appreciated by persons skilled in the art from the following detailed description when read in conjunction with the accompanying drawing wherein.

DETAILED DESCRIPTION

Figure 1:
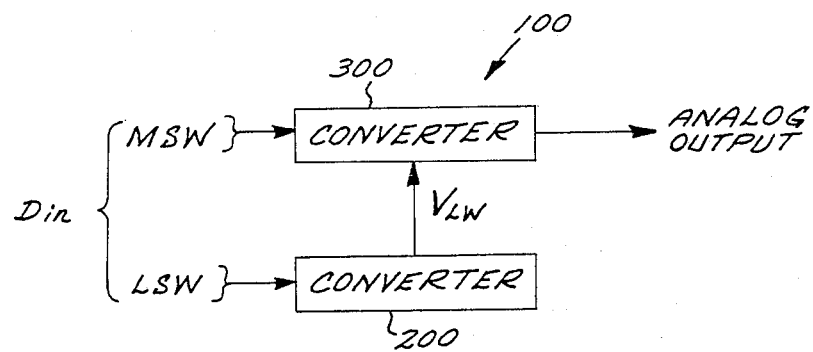
FIG. 1 is a block diagram of a multi-stage digital-to-analog conversion system which includes a plurality of digital-to-analog converters and in which the dislosed invention is utilized.

In the following detailed description and in the several figures of the drawing, like elements are identified with like reference numerals.

Referring now to the block diagram of FIG. 1, shown therein is a digital-to-analog conversion system 100 which includes first and second staged converters 200, 300. The conversion system 100 converts a digital signal $D_{in}$ which includes a plurality of bits that are grouped into two groups identified as LSW and MSW. The LSW group corresponds to the least significant bits of the digital signal $D_{in}$ and the MSW group corresponds to the most significant bits of the digital signal $D_{in}$.

The LSW group is provided to the first converter 200, and the MSW is provided to the second converter 300, which also accepts the output $V_{LW}$ provided by the first converter 200. The output of the second converter 300 is the output of the digital-to-analog conversion system 100. To the extent appropriate, the digital conversion system 100 may include more stages, for example, to allow for conversion of a digital signal having a larger number of bits. For example, the conversion system 100 may have another converter stage which accepts more significant bits than the MSW group and would also accept the analog output provided by the second converter 300.

Staged conversion systems such as that generally depicted in FIG. 1 are known to persons skilled in the art. As is further known to persons skilled in the art, the output of a lesser weighted stage is coupled to the stage of next greater weight via an LSB element such as a capacitor or resistor (depending on the weighting elements used).

The disclosed invention is directed to a switched capacitor array for use in a staged digital-to-analog conversion system which reduces the differential non-linearity associated with the coupling LSB elements.

Figure 2:
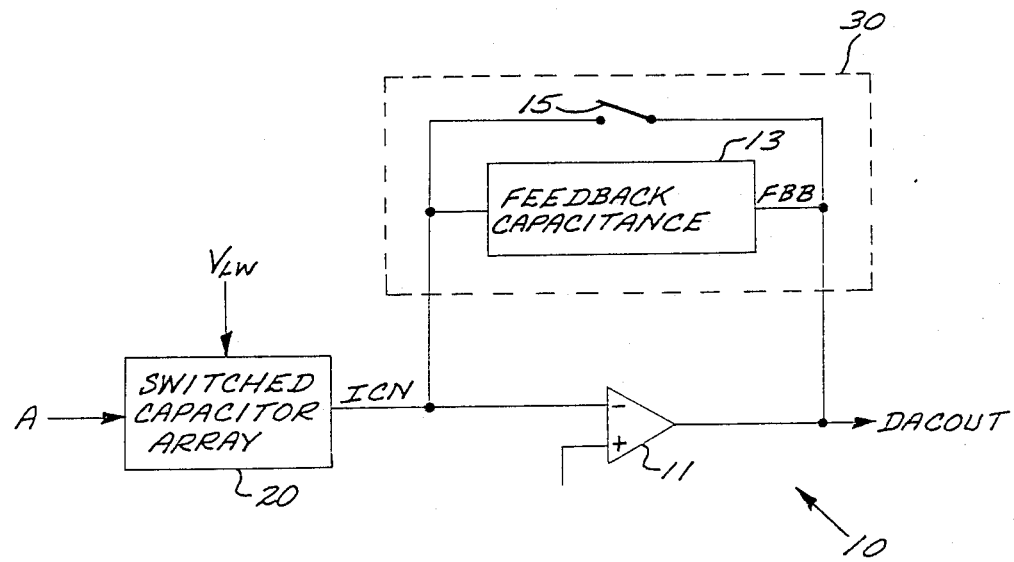
FIG. 2 is a generalized block diagram of a digital-to-analog converter which advantageously utilizes the switched capacitor array of the invention.

Referring now to the block diagram of FIG. 2, shown therein is a digital-to-analog (D/A) converter 10 which may be used as a stage for converting a group of bits other than the least significant bits in a multi-stage conversion system. The stage for converting the least significant bits in a multi-stage conversion system does not utilize the advantages provided by the invention.

The D/A converter 10 includes a switched capacitor array 20 for accepting a multi-bit parallel binary input signal A which is a group of bits of a digital signal to be converted by a plurality of staged converters. For example, the input signal A may correspond to the MSW group of the conversion system 100 of FIG. 1 The switched capacitor array 20 further accepts the analog output $V_{LW}$ from a converter stage (not shown) for converting the next group of bits of lesser significance. The analog output $V_{LW}$ is called the analog output of the bits of lesser significance or weight. The output of the switched capacitor array 20 is provided at a node ICN which is coupled to the inverting input of an operational amplifier 11. The operational amplifier 11 provides an analog output signal DACOUT which is the analog version of the parallel binary input A and the bits of lesser significance which contributed to the analog signal $V_{LW}$ provided to the switched capacitor array 20.

A feedback circuit 30 is coupled between the output of the operational amplifier 11 and the node ICN which is coupled to the inverting input of the operational amplifier 11. The feedback circuit 30 includes a feedback capacitance 13 and a reset switch 15 in parallel therewith. Particularly, the feedback capacitance 13 is coupled at a node FBB to the output of the operational amplifier 11. The noninverting input of the operational amplifier 11 is coupled to a common voltage $V_c$, which may be ground.

The value of the feedback capacitance 13 may be selected to provide a desired converter gain. As disclosed herein, the feedback capacitance 13 includes a plurality of substantially identical parallel capacitors each of which has substantially the same value as each of the switched capacitors in the switched capacitor array 20. The use of capacitors of substantially identical value is advantageous with integrated circuit implementation, since they will track each other in value with some variations in processing.

Figure 3:
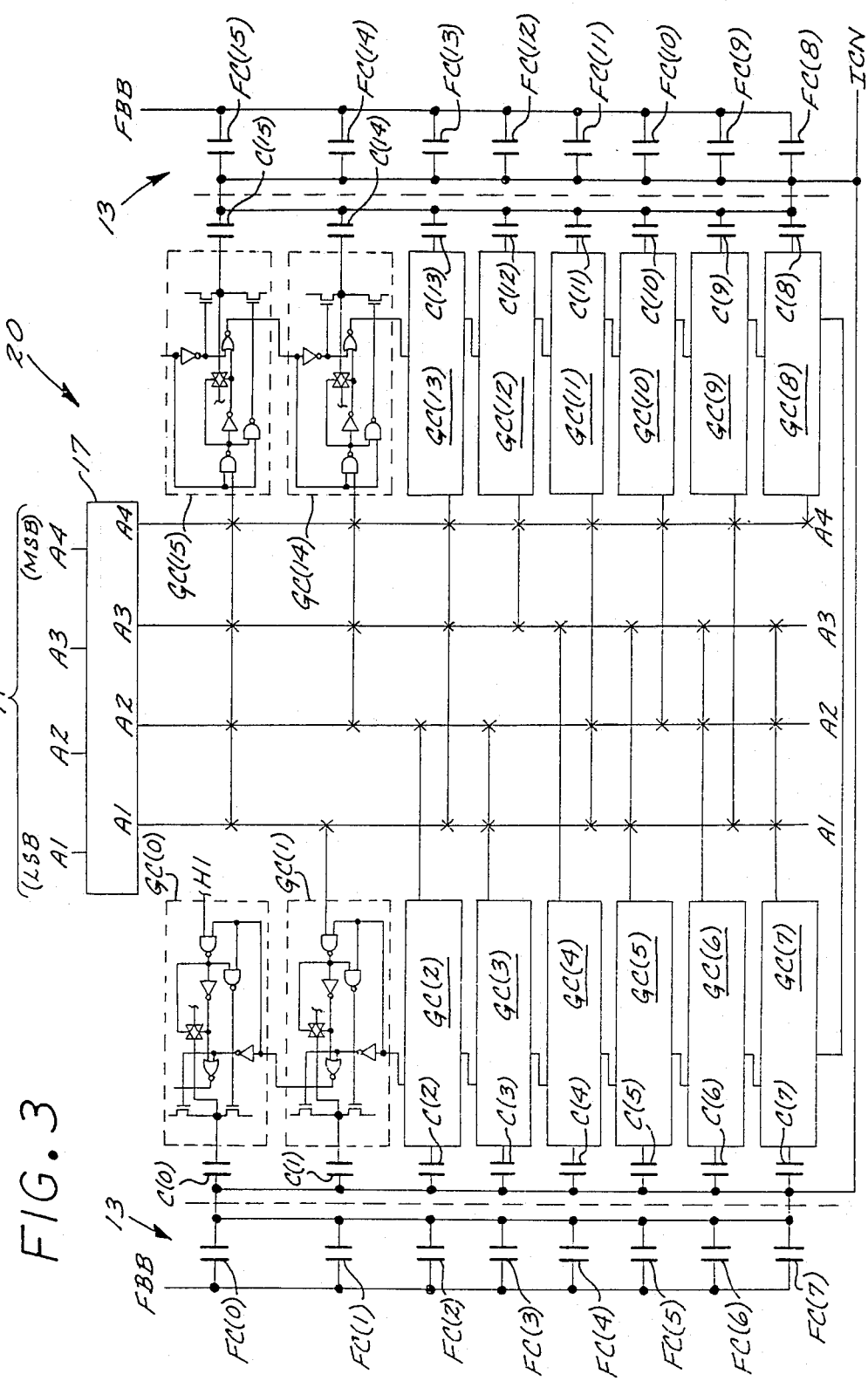
FIG. 3 is a schematic diagram of the switched capacitor array of the invention which may be utilized in the analog-to-digital converter of FIG. 2.

Referring now to FIG. 3, shown therein is a schematic diagram of the feedback capacitance 13 and the switched capacitor array 20 which includes a buffer 17 for accepting the parallel binary input A. The input signal A includes four parallel bits A1, A2, A3, A4, wherein A1 is the least significant bit and A4 is the most significant bit. For reference purposes, the four bits A1, A2, A3, A4 of the parallel input A shall be referenced as having a decimal value N. The outputs of the logic network 17 are the input bits A1, A2, A3, A4. The outputs of the buffer 17 are respectively represented by vertical line segments identified by respective signal names (i.e., A1, A2, A3, A4). As is well known, the buffer 17 may be also provide level shifting functions to provide outputs having the appropriate logic levels.

The switched capacitor array 20 further includes switched capacitors C(0) through C(15), which are all of substantially identical value C. Each of the switched capacitors C(0) through C(15) are coupled to the node ICN that is coupled to the inverting input of the operational amplifier 11 (FIG. 2). The other terminals of the switched capacitors C(0) through C(15) are respectively coupled to respective gating circuits GC(0) through GC(15), each of which is of the general form shown in FIG. 3 and discussed further below.

For reference purposes, the gating circuits GC(0) through GC(15) shall be considered as being a sequence beginning with GC(0) and continuing through GC(15). Thus, for example, GC(0) is prior to GC(1), while GC(2) is subsequent to GC(1). Similarly, the switched capacitors C(0) through C(15) shall be considered a sequence beginning with C(0) and continuing through C(15).

The gating circuit GC(0) receives a HIGH logic signal as its input, while each of the gating circuits GC(1) through GC(15) receives predetermined input(s) from the logic network 17, and the input(s) to each gating circuit GC are schematically represented by a horizontal input line segment connected to such gating circuit. The actual input(s) to a particular gating circuit GC are identified by x's at the intersections of the appropriate signal line segments with the input line segment. Thus, the input to the gating circuit GC(1) for the switched capacitor C(1) is A1.

The following Table I sets forth the inputs to the gating circuits GC(1) through GC(15).

TABLE I

| GC(1)  | A1 |    |    |    |
|--------|----|----|----|----|
| GC(2)  |    | A2 |    |    |
| GC(3)  | A1 | A2 |    |    |
| GC(4)  |    |    | A3 |    |
| GC(5)  | A1 |    | A3 |    |
| GC(6)  |    | A2 | A3 |    |
| GC(7)  | A1 | A2 | A3 |    |
| GC(8)  |    |    |    | A4 |
| GC(9)  | A1 |    |    | A4 |
| GC(10) |    | A2 |    | A4 |
| GC(11) | A1 | A2 |    | A4 |
| GC(12) |    |    | A3 | A4 |
| GC(13) | A1 |    | A3 | A4 |
| GC(14) |    | A2 | A3 | A4 |
| GC(15) | A1 | A2 | A3 | A4 |

The feedback capacitance 13 includes the capacitors FC(0) through FC(15) which are coupled in parallel between the node ICN and the node FBB. Each of the feedback capacitors FC(0) through FCC(15) has a capacitance value C, the same as the switched capacitors C(0) through C(15). As indicated in FIG. 2, the node FBB is coupled to the output of the operational amplifier 11. The feedback capacitors FC(0) through FC(15) are preferably adjacent the switched capacitors C(0) through C(15) in order to provide a feedback capacitance value of 16C which is very close to the parallel capacitance of all the switched capacitors C(0) through C(15).

Figure 4:
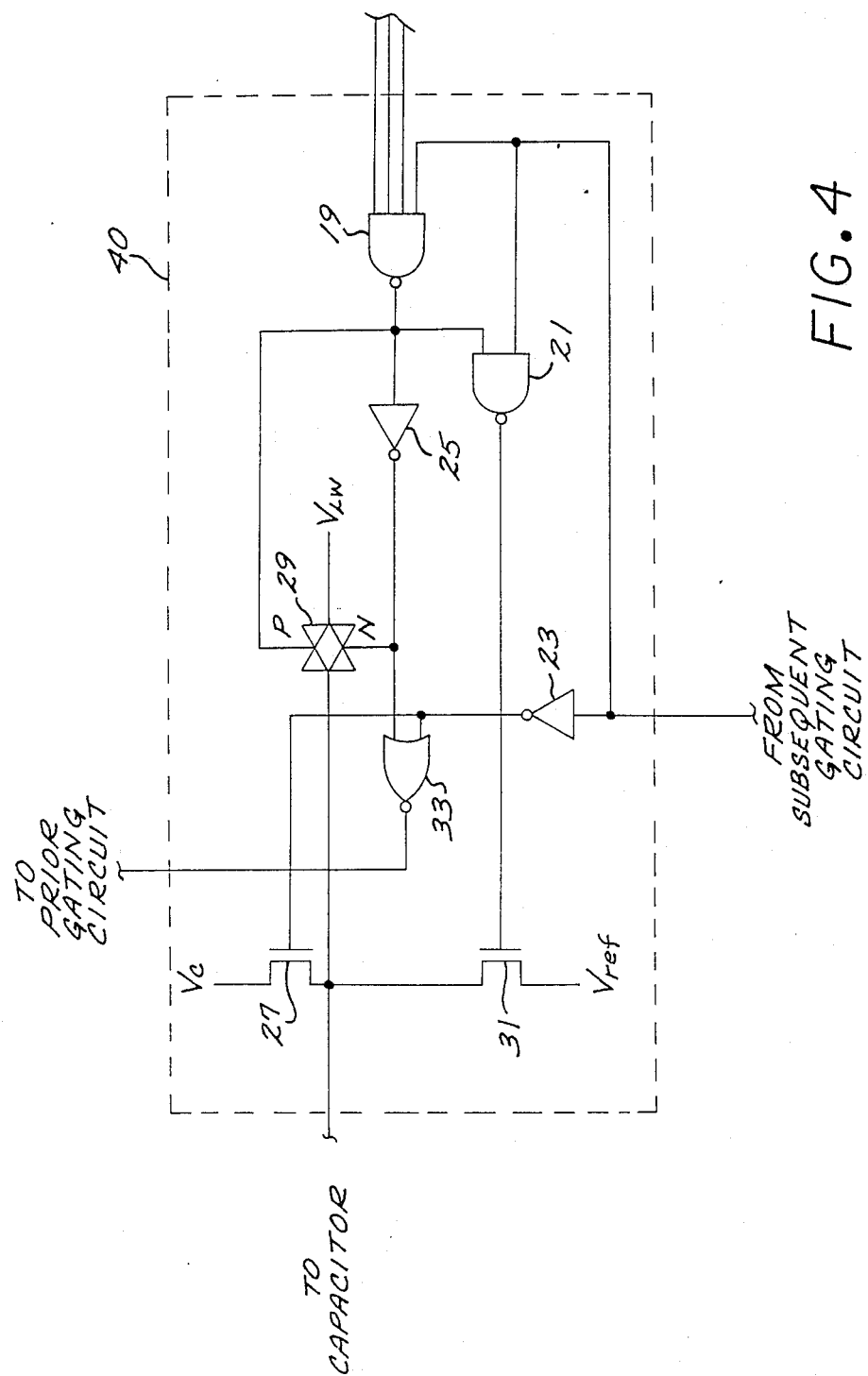
FIG. 4 is a schematic circuit diagram of a gating circuit for switching the switched capacitors of the switched capacitor array of FIG. 3.

Referring now to FIG. 4, shown therein is a generalized gating circuit 40 which may be utilized for each of the gating circuits GC(0) through GC(15). The gating circuit 40 includes a four input NAND gate 19 which accepts as one of its inputs a feedback signal from the subsequent gating circuit, except for the gating circuit GC(15) for which there is no subsequent gating circuit. The NAND gate 19 of the gating circuit GC(15) receives all of its inputs from the buffer 17.

One or more of the other inputs to the NAND gate 19 are appropriately coupled to predetermined signals from the buffer 17, as defined by Table I. The inputs of the NAND gate 19 that are not coupled to signals from the buffer 17 or to the feedback signal from the subsequent gating circuit are coupled to a HIGH logic level. Alternatively, each NAND gate 19 for each of the gating circuits GC(0) through GC(15) could be configured to include only as many inputs as required.

It should be noted that as to the NAND gate 19 of the gating circuit GC(0), one of its inputs receives the feedback signal from the gating circuit GC(1) while its other input(s) are coupled to a HIGH logic level.

The output of the NAND gate 19 is provided to one input to a two-input NAND gate 21. The other input to the NAND gate 21 is provided by the feedback signal from the subsequent gating circuit, except for the gating circuit GC(15). The second input of the NAND gate 21 for the gating circuit GC(15) is coupled to a HIGH logic level. Effectively, the NAND gate 21 for the gating circuit GC(15) functions as an inverter and may accordingly be replaced with an inverter that receives its input from the NAND gate 19.

The feedback signal from the subsequent gating circuit is further provided to an inverter 23, except for the gating circuit GC(15) which has the input to its inverter 23 coupled to a HIGH logic level.

The output of the inverter 23 is coupled to the gate of an N-channel switching transistor 27 which has its source coupled to the common voltage $V_c$. The drain of the N-channel transistor 27 is coupled to the associated switched capacitor.

The output of the NAND gate 19 is further coupled to an inverter 25 and the P side of a transmission gate 29. The output of the inverter 25 is coupled to the N side of the transmission gate 29. The input of the transmission gate 29 is coupled to the analog signal $V_{LW}$ and the output of the transmission gate 29 is coupled to the associated switched capacitor.

The output of the NAND gate 21 is coupled to the gate of a P-channel switching transistor 31 which has its source coupled to a reference voltage $V_{ref}$ which is positive relative to the common voltage $V_c$. The drain of the P-channel transistor 31 is coupled to the associated switched capacitor.

The outputs of the inverters 23, 25 are provided as inputs to a NOR gate 33 which provides the feedback signal to a prior gating circuit, if any. As shown in FIG. 3, the gating circuit GC(0) for the switched capacitor C(0) does not provide a feedback signal and the output of the NOR gate 33 is not utilized.

As will be discussed in more detail below, when a particular digital input A having a decimal value N is to be converted, such input causes the switched capacitor C(N) to be coupled to the analog signal $V_{LW}$ and causes the capacitors C(N−1) through C(0) to be switched to $V_c$. The remaining switched capacitors remain coupled to $V_{ref}$. Specifically, for a digital input A having a decimal value N, the gating circuit GC(N) causes its associated capacitor C(N) to be switched to the analog signal $V_{LW}$. The prior gating circuits GC(N−1) through GC(0) cause their associated switched capacitors C(N−1) through C(0) to be switched to the common voltage $V_c$.

Thus, a digital input A having a decimal value N effectively addresses the gating circuit GC(N) to cause it to couple its associated capacitor C(N) to the analog voltage $V_{LW}$. However, it should be noted that since the value N will not be less than zero, the gating circuit GC(0) does not have to be addressed by any inputs from the buffer 17. Instead, the inputs to the NAND gate 19 of the gating circuit GC(0) that otherwise could accept inputs from the buffer 17 may coupled to a HIGH logic level, as schematically shown in FIG. 3. Thus, the NAND gate 19 of the gating circuit may be a two input NAND gate, or may be an inverter having the feedback signal from the gating circuit GC(1) as its input. When the value of N is zero, the interconnection of the gating circuits causes the gating circuit GC(0) to couple its associated capacitor C(0) to the analog signal $V_{LW}$.

For reference purposes, a gating circuit GC which causes its associated capacitor to be switched to the analog signal $V_{LW}$ or to the common voltage $V_C$ pursuant to an input A is considered to be activated.

Referring again to FIGS. 2 and 3, the operation of the digital-to-analog converter 10 is as follows. The reset switch 15 is closed, whereby the DACOUT signal is set to a virtual ground as a result of the connection of the output of the operational amplifier 11 to its inverting input. Concurrently, the switched terminals of the switched capacitors C(1) through C(15) are all coupled to the reference voltage $V_{ref}$, which can be accomplished by setting all the parallel input bits A1, A2, A3, A4 to zeroes. Pursuant to setting the input bits A1, A2, A3, A4 to LOW, the switched terminal of the capacitor C(0) is coupled to the analog output $V_{LW}$.

Specifically, when all of the bits of the digital input A are zeroes, the NAND gate 19 of the gating circuit GC(15) provides a HIGH output and the NAND gate 21 provides a HIGH output. The output of the inverter 25 is therefore LOW, and the output of the inverter 23 is LOW. As a result, the transmission gate 29 and the N-channel transistor 27 are nonconductive. The P-channel transistor 31 is conductive and the capacitor C(15) is coupled to the reference voltage $V_{ref}$. The feedback signal to the gating circuit GC(14) is therefore HIGH, which in turn causes the switched capacitor C(14) to be coupled to the reference voltage $V_{ref}$ and the feedback signal to the gating circuit GC(13) to be HIGH. Effectively, all of the feedback signals go HIGH in response to the bits of the digital signal A being all zeroes As a result, the switched capacitors C(15) through C(1) are coupled to the reference voltage $V_{ref}$.

The reset switch 15 is then opened, and a parallel binary input signal A having a decimal value N is provided to the logic network 17. For N greater than 0, the NAND gate 19 of the gating circuit GC(N) will provide a LOW output, and the NAND gate 21 of the gating circuit GC(N) will provide a HIGH output. The feedback signal to the inverter 23 of the gating circuit GC(N) is HIGH (as a result of the above reset procedure), and its output is therefore LOW. As a result, transmission gate 29 of the addressed gating circuit GC(N) is conductive and the N-channel and P-channel transistors 27, 31 are nonconductive. Therefore, the associated switched capacitor C(N) is switched to the analog signal $V_{LW}$. The feedback signal provided by the NOR gate 33 is LOW.

Further addressing the situation where the decimal value N of the digital input A is greater than 0, since the feedback signal provided by the gating circuit GC(N) is LOW, the prior gating circuit GC(N−1) switches its associated capacitor C(N−1) to the common voltage $V_c$ and provides a feedback signal that is LOW. It should therefore be readily evident that the gating circuits GC(N−1) through GC(0) cause their respective associated capacitors C(N−1) through C(0) to be switched to the common voltage $V_c$. It should also be understood that such switching occurs sequentially, starting with the gating circuit GC(N−1) that is immediately prior to the addressed gating circuit GC(N).

Where the input A provided after reset has a decimal value of 0, the capacitors C(1) through C(15) remain coupled to the reference voltage $V_{ref}$ and the capacitor C(0) remains coupled to the analog signal $V_{LW}$.

Effectively the foregoing utilizes a predetermined switched capacitor as the LSB capacitor. Specifically, the switched capacitor that is utilized as the LSB input capacitor is the switched capacitor that would be switched to $V_C$ in the next increment of the input A. That eliminates the differential nonlinearity that would otherwise be present with a fixed LSB capacitor.

In the foregoing D/A converter 10, the feedback capacitance 13 is shown as having a value of 16C. With that feedback capacitance value, the output DACOUT of the D/A converter is as follows:

$$\text{DACOUT} = V_{ref} \times \frac{NC}{16C} + V_{LW} \times \frac{C}{16C} \quad \text{(Eq. 1)}$$

It should be readily understood by persons skilled in the art that other capacitance values may be utilized for the feedback capacitance 13. With such other feedback capacitance values, the output of the D/A converter will be as follows, where $F_c$ is the value of the feedback capacitance:

$$\text{DACOUT} = V_{ref} \times \frac{NC}{F_c} + V_{LW} \times \frac{C}{F_c} \quad \text{(Eq. 2)}$$

Figure 5:
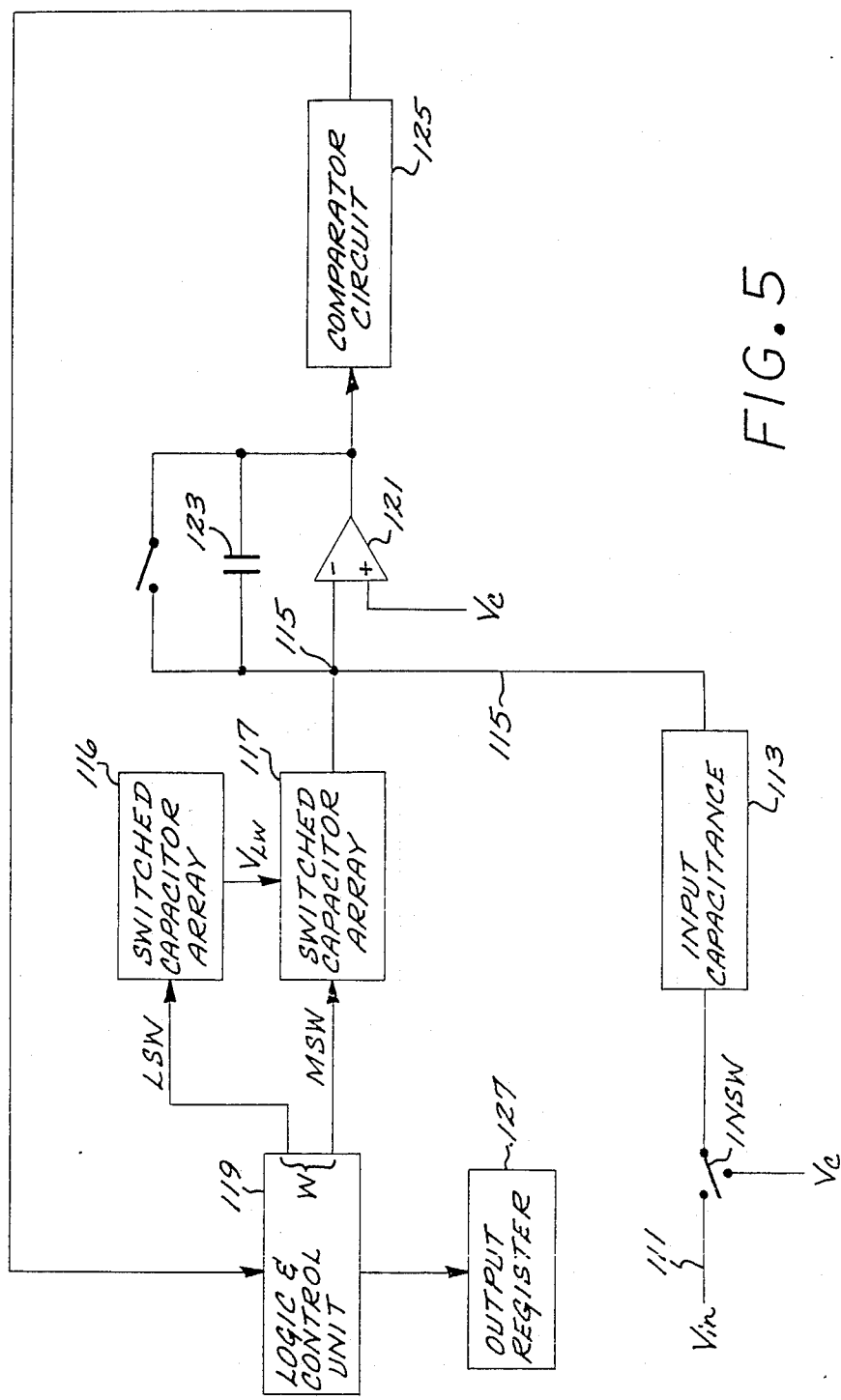
FIG. 5 is a generalized block diagram of an analog-to-digital converter which advantageously utilizes the switched capacitor array of the invention.

Referring now to FIG. 5, shown therein is a block diagram of an analog-to-digital (A/D) converter 60 in which the switched capacitor array of the invention (discussed relative to FIGS. 3 and 4) may be advantageously utilized. The A/D converter 60 includes an input node 111 for accepting an input voltage $V_{in}$ which is to be converted. One node of an input capacitance 113 is selectively coupled to the input node 111 or to a common voltage $V_c$ by an input switch INSW. The common voltage $V_c$ may be ground. The other node of the input capacitance 113 is coupled to a node 115. Also coupled to the node 115 is the output of a switched capacitor array 117 which accepts inputs from a logic control unit 119 and another switched capacitor array 116.

The logic control unit 119 provides a parallel binary signal W which includes a least significant word LSW and a most significant word MSW, which are respectively provided as inputs to the switched capacitor arrays 116 and 117.

The switched capacitor array 117 is substantially similar to the switched capacitor array 20 disclosed above relative to FIGS. 3 and 4. The output node ICN of the switched capacitor array 117, as it corresponds to the switched capacitor array 20, is coupled to the node 115. The switched capacitor array 116 may be similar to the switched capacitor array 20, except that it may not have to switch the Nth capacitor to an analog signal provided by an array of lesser weight. Thus, the switched capacitor array 116 switches the (N−1)th capacitor and any prior capacitors in response to the LSW having a decimal value N.

The output of the switched capacitor array 116 (which is provided at a node similar to the node ICN of the switched capacitor array 20 of FIG. 3) is provided as the analog signal $V_{LW}$ to the switched capacitor array 117.

To the extent that the switched capacitor array 117 is substantially similar to the switched capacitor array 20 of FIG. 3, the feedback capacitors shown with the switched capacitor array 20 may be advantageously utilized as the input capacitance 113. Specifically, the node FBB of the capacitors FC(0) through FC(15) would be coupled to the input switch INSW. Further input capacitance may also be provided, for example, with the switched capacitor array 116.

The node 115 is coupled to the inverting input of an operational amplifier 121 which has its noninverting input coupled to the common voltage $V_c$. A feedback capacitor 123 and a reset switch RSW are coupled in parallel between the output and the inverting input of the operational amplifier 121. The output of the operational amplifier 121 is further coupled to a comparator circuit 125 which, for example, provides a comparison output indicating whether the operational amplifier output is less than or greater than a predetermined threshold level.

The comparison output of the comparator circuit 125 is provided to the logic and control circuit 119 which provides the binary input to the switched capacitor array 117. The logic and control unit 119 provides to an output register 127 a digital value indicative of the input voltage $V_{in}$.

The operation of the D/A converter 60 is in accordance with known D/A converters. A conversion cycle begins with the switch INSW coupled to the common voltage $V_c$, and the reset switch RSW closed. The reset switch RSW is then opened and the input switch INSW is coupled to the input node 111. The logic control unit periodically provides inputs to the switched capacitor arrays 116, 117 pursuant to a known technique, such as successive approximation. When the output of the operational amplifier 121 is sufficiently close to the predetermined threshold of the comparator circuit 125, an output is provided to the output register 127. Such output is based on the input to the switched capacitor arrays 116, 117 which resulted in the operational amplifier output that was sufficiently close to the threshold of the comparator circuit 125.

While capacitors have been disclosed as the switched elements in the foregoing D/A converter 10 and A/D converter 60, other elements such as substantially equal valued resistors or current sources may be utilized. For example, the switched capacitors C(0) through C(15) and the feedback capacitors FC(0) through FC(15), which are of substantially equal value, may be replaced with resistors of substantially equal value. As still another alternative, the switched capacitors C(0) through C(15) may be replaced with switched current sources of substantially equal value, and the feedback capacitors FC(0) through FC(15) would not be utilized. The switched current sources would be controlled by respective gating circuits to provide respective current outputs in response to the activation of respective gating circuits. The outputs of the current sources would be coupled to the node ICN for summing.

Although the present invention has been discussed in connection with A/D and D/A converters, it may also be employed in other environments. For example, the concepts of the present invention may be employed in a digitally controlled amplifier, or multiplying D/A converter, or similar device wherein the reference voltage $V_{ref}$ is replaced by an input signal and wherein gain control is provided by the digital input signal A.

Although the foregoing has been a description and illustration of specific embodiments of the invention, various modifications and changes thereto can be made by persons skilled in the art without departing from the scope and spirit of the invention as defined by the following claims.

What is claimed is:

1. A digital-to-analog converter for use in a multistage digital-to-analog converter which is responsive to a digital input signal and to an analog input signal provided by a digital-to analog converter stage of lesser weight, said converter providing an analog output signal indicative of said analog input signal and the digital input signal, and comprising:
   an operational amplifier having an inverting input and a noninverting input for providing the analog output signal at its output;
   a feedback capacitance and a switch coupled in parallel between the inverting input and the output of said operational amplifier;
   M capacitors of substantially identical value, designated C(I) where I is an integer from 0 through M−1, each capacitor having first and second terminals, said first terminal, being coupled together to the inverting input of said operational amplifier;
   input means responsive to a digital input signal having a value N for providing a logic output signal indicative of said digital input signal; and
   selection means responsive to said logic output signal (1) for switching the second terminal of a selected capacitor C(N) to the analog input signal provided by the digital-to-analog converter stage of lesser weight, and (2) for sequentially switching the second terminals of the capacitors C(N−1) through C(0) to a predetermined voltage;
   said switch being controllably closed prior to conversion of said digital input signal.

2. The digital-to-analog converter of claim 1 wherein said selection means for each of said switched capacitors comprises respective gating means responsive to said logic output signal for cooperating to switch the second terminal of said selected capacitor C(N) to said analog signal output and to provide sequential switching of the second terminals of said capacitors C(N−1) through C(0).

3. The digital-to-analog converter of claim 2 wherein one of said respective gating means is activated by said logic output to switch the second terminal of its associated capacitor C(N) to said analog signal output, said activated gating means selectively causing other gating means to be sequentially activated to switch the second terminals of the capacitors C(N−1) through C(0) to said predetermined voltage.

4. The digital-to-analog converter of claim 3 wherein said capacitors are arranged in a sequence beginning with a first capacitor C(0) through a last capacitor C(M), and wherein said sequential switching is in the direction toward said first capacitor C(0).

5. The digital-to-analog converter of claim 4 wherein each of said gating means for said first capacitor C(0) through the next to last capacitor C(M−1) receives a feedback signal from the gating means for the switched capacitor next in sequence, said feedback signal indicative of whether the feeding gating means has been activated to switch the second terminal of its associated switched capacitor.

6. The digital-to-analog converter of claim 5 wherein a feedback signal indicating that the feeding gating means has been activated causes the receiving gating means to be activated in response to such feedback signal to switch the second terminal of its associated capacitor to said predetermined voltage.

7. A digital-to-analog converter for use in a multistage digital-to-analog converter which is responsive to a digital input signal and to an analog input signal provided by a digital-to-analog converter stage of lesser weight, said converter providing an analog output signal indicative of said analog input signal and the digital input signal, and comprising:
   an operational amplifier having an inverting input and a noninverting input for providing the analog output signal at its output;
   a feedback impedance and a switch coupled in parallel between the inverting input and the output of said operational amplifier;
   M switched passive elements of substantially identical value, designated E(I) where I is an integer from 0 through M−1, each switched element having first and second terminals, said first terminals being coupled together to the inverting input of said operational amplifier;
   input means responsive to a digital input signal having a value N for providing a logic output signal indicative of said digital input signal; and
   selection means responsive to said logic output signal (1) for switching the second terminal of a selected element E(N) to the analog input signal provided by the digital-to-analog converter stage of lesser weight, and (2) for sequentially switching the second terminals of the elements E(N−1) through E(0) to a predetermined voltage.

8. The digital-to-analog converter of claim 7 wherein said selection means for each of said switched passive elements comprises respective gating means responsive to said logic output signal for cooperating to switch the second terminal of said selected switch element E(N) to said analog signal output and to provide sequential switching of the second terminals of said passive elements E(N−1) through E(0) to said predetermined voltage.

9. The digital-to-analog converter of claim 8 wherein one of said respective gating means is activated by said logic output to switch the second terminal of its associated passive element E(N) to said analog signal output, said activated gating means selectively causing other gating means to be sequentially activated to switch the second terminals of their associated passive elements E(N−1) through E(0) to said predetermined voltage.

10. The digital-to-analog converter of claim 9 wherein said passive elements are arranged in a sequence beginning with a first passive element E(0) through a last passive element E(M), and wherein said sequential switching is in the direction toward said first passive element E(0).

11. The digital-to-analog converter of claim 10 wherein each of said gating means for said first passive element E(0) through the next to last passive element (M−1) receives a feedback signal from the gating means for the next in sequence switched passive element, said feedback signal indicative of whether the feeding gating means has been activated to switch the second terminal of its associated switched passive element.

12. The digital-to analog converter of claim 11 wherein a feedback signal indicating that the feeding gating means has been activated causes the receiving gating means to be activated in response to the feedback signal to switch the second terminal of its associated switched passive element to said predetermined voltage.

* * * * *